United States Patent [19]

Soclof

[11] Patent Number: 4,522,682
[45] Date of Patent: Jun. 11, 1985

[54] METHOD FOR PRODUCING PNP TYPE LATERAL TRANSISTOR SEPARATED FROM SUBSTRATE BY O.D.E. FOR MINIMAL INTERFERENCE THEREFROM

[75] Inventor: Sidney I. Soclof, San Gabriel, Calif.

[73] Assignee: Rockwell International Corporation, El Segundo, Calif.

[21] Appl. No.: 390,496

[22] Filed: Jun. 21, 1982

[51] Int. Cl.³ .................. H01L 21/306; H01L 29/72; B44C 1/22; C03C 15/00
[52] U.S. Cl. ................ 156/647; 29/576 W; 29/580; 148/187; 156/648; 156/651; 156/657; 156/662; 357/35
[58] Field of Search ............... 156/647, 648, 649, 653, 156/657, 659.1, 662, 651; 29/576 W, 580; 148/1.5, 187; 427/93; 357/35, 47, 48, 49, 50, 55

[56] References Cited

U.S. PATENT DOCUMENTS 3,813,585 5/1974 Tarui et al. .............. 156/647 X
4,293,373 10/1981 Greenwood ............. 156/648 X
4,397,075 8/1983 Fatula et al. ............. 156/647 X

*Primary Examiner*—William A. Powell
*Attorney, Agent, or Firm*—H. Fredrick Hamann; Wilfred G. Caldwell

[57] ABSTRACT

The invention provides a unique sub-micron dimensioned PNP type transistor and method of making the same, wherein hundreds of such transistors may be fabricated on a single chip with each transistor comprising an active region surrounded by field oxide completely isolating it from the substrate and its effects on operation. Spaced apart slots made in the substrate permit the introduction of orientation dependent etching fluid therein to at least substantially etch semi-arrays of active regions of the substrate away from the substrate except for spaced apart supports therealong. Oxidation serves to support the semi-arrays and subsequent steps directly from the substrate or by webs of oxidation along the tops of the semi-arrays connected to the substrate. The support is necessary while orthogonal slots are provided permitting access to opposed sides of the active regions for doping P+ from each end, which P+ is driven in from both sides to provide an P+NP+ emitter base collector transistor active region to which electrical connections are applied using conventional techniques providing almost complete reduction of the parasitic capacitances and resistances because of the total oxide isolation of the active regions from the substrate.

4 Claims, 11 Drawing Figures

METHOD FOR PRODUCING PNP TYPE LATERAL TRANSISTOR SEPARATED FROM SUBSTRATE BY O.D.E. FOR MINIMAL INTERFERENCE THEREFROM

FIELD OF THE INVENTION

This invention is a novel structure and method for forming a submicron PNP type lateral dielectrically isolated transistor utilizing VLSI chip processing steps to fabricate hundreds of such devices simultaneously.

BACKGROUND OF THE INVENTION

Techniques extracted from the prior art come from the field of submicron fabrication technology wherein the dimensional resolution is now comparable to or even smaller than the thicknesses of the thermally grown silicon oxide layers on silicon. Also, the dimensions are now comparable or even smaller than the base widths used for double diffused transistors, i.e.; 0.4 to 1.0 micrometers. From these techniques, the novel structure and method for the NPN lateral transistor with greatly reduced parasitic capacitance and resistances is achieved.

SUMMARY OF THE INVENTION

The invention is a novel lateral PNP type transistor formed on a substrate by orthogonal slots which define each active region and permit undercutting of the active regions via a first pair of opposed slots, followed by oxidation for support of the spaced apart semiarrays of transistor active regions formed by the first pair of slots, while P+ doping is introduced through the second pair of opposed slots and driven in to comprise a P+NP+ active region totally isolated from the substrate by substrate oxidation. Electrical connectings are made in conventional fashion on the P+ emitter, N base and P+ collector.

BRIEF DESCRIPTION OF A PREFERRED EMBODIMENT OF THE INVENTION

In the device produced in accordance with the present invention, the effects of the substrate are minimized relative to the operation of the device. It should be realized that the active region may be completely contained with the surface area of $3d \times 5d$ or $15d^2$ wherein d is only 0.4 micrometers. The isolated region is completely separated from the substrate by oxidation and the parasitic capacitances and resistances are almost completely reduced to a minimum value attainable because the transistor is reduced essentially to just its electronically active region. Whereas in the conventional (vertical) transistor, the electrically active region is only a very. small fraction of the total transistor area. The dielectric isolation between transistors offered by the same substrate oxidation has advantages with respect to high frequency performance, high voltage integrated circuits, radiation resistance, and circuit flexibility., i.e., the process can provide NPN, PNP, JFET, MOSFET, etc., on the same integrated circuit chip.

Figure 1:
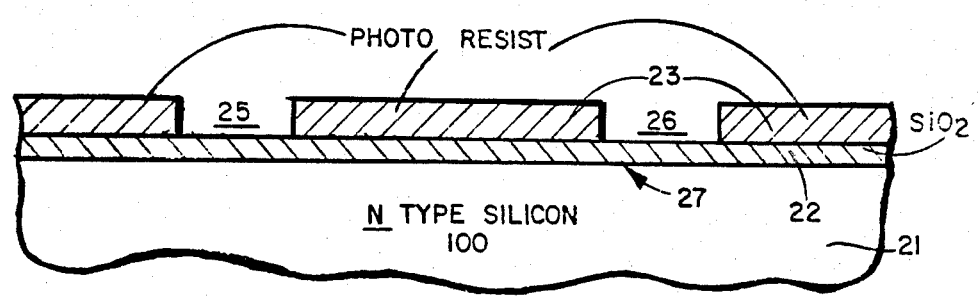
FIG. 1 is a view in section of an N-type substrate having patterned resist thereover for the subsequent steps.

Reference now to FIG. 1 shows a silicon substrate 21 of the N type, with thermally grown oxide layer 22, and patterned by photoresist 23 to leave exposed the regions 25 and 26 which will be subsequently slotted. It should be noted that the upper surface 27 of substrate 21 is a (100) surface useful in orientation dependent etching.

Figure 2:
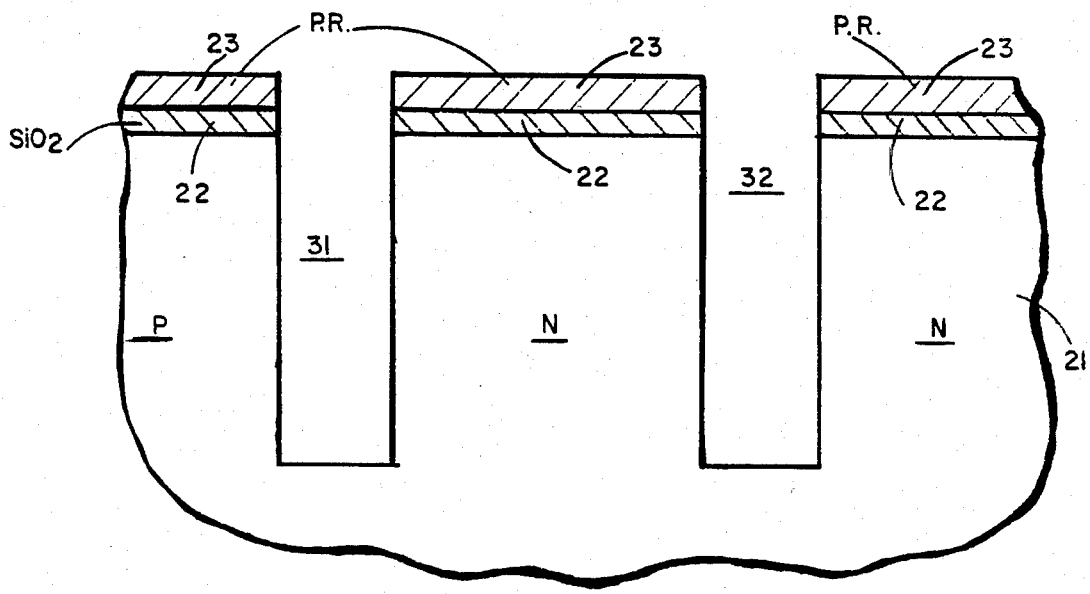
FIG. 2 shows a structure of FIG. 1 after spaced-apart slots have been formed.

In the sectional view of FIG. 2, slots 31 and 32 have been formed into substrate 21 through upper surface 27 in the unprotected regions 25 and 26. Slotting may be achieved by ion milling or etching and thus removes the unprotected portions of the substrate oxide layer 22.

Figure 3:
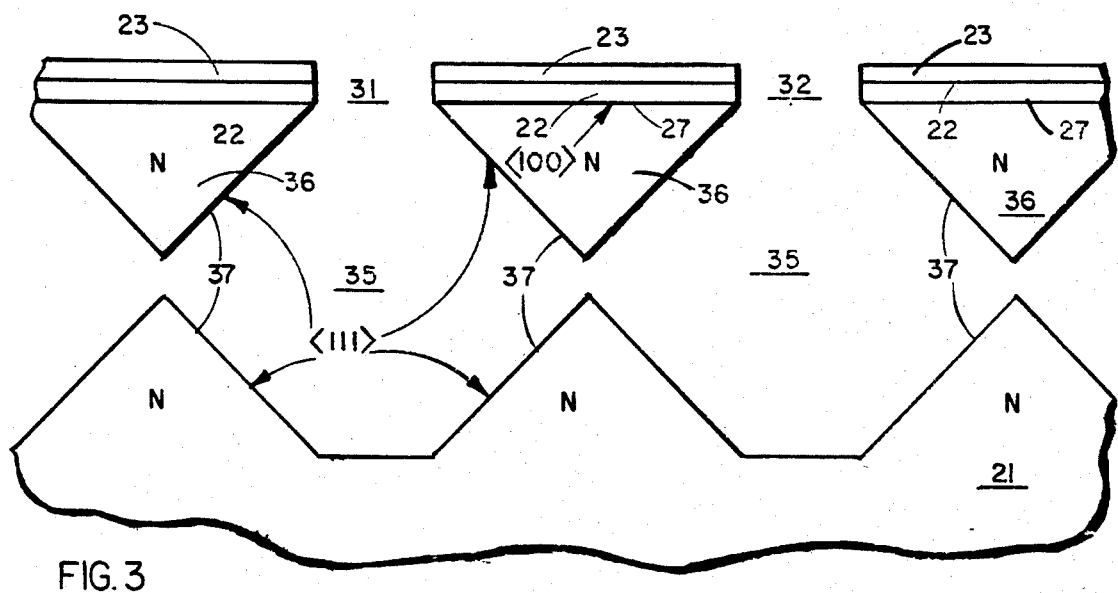
FIG. 3 shows the same structure following the etching step wherein the etching fluid is introduced into the slots previously formed.

In FIG. 3 there is shown the substrate 21 after orientation dependent etching fluid is introduced through slots 31 and 32 to attack the substrate, oxide layer 22 remaining after the resist 23 has been removed protects the upper surface of the triangular semi-arrays 36 from attack by the fluid. The orientation dependent etching fluid removes the regions 35 from the substrate 21, which regions are bounded by planes (111) 37.

It may seem that the semi-arrays 36 are separated from the substrate 21, however, at spaced apart positions along the semi-array regions 36 spaced apart supports of silicon are left to prevent the semiarrays 36 from collapsing into the voids 35. Alternatively, the semi-array regions 36 may need be only supported at their ends which can be accomplished by leaving a boundary region of oxide 22 on the surface (100) shown at 27.

Figure 4:
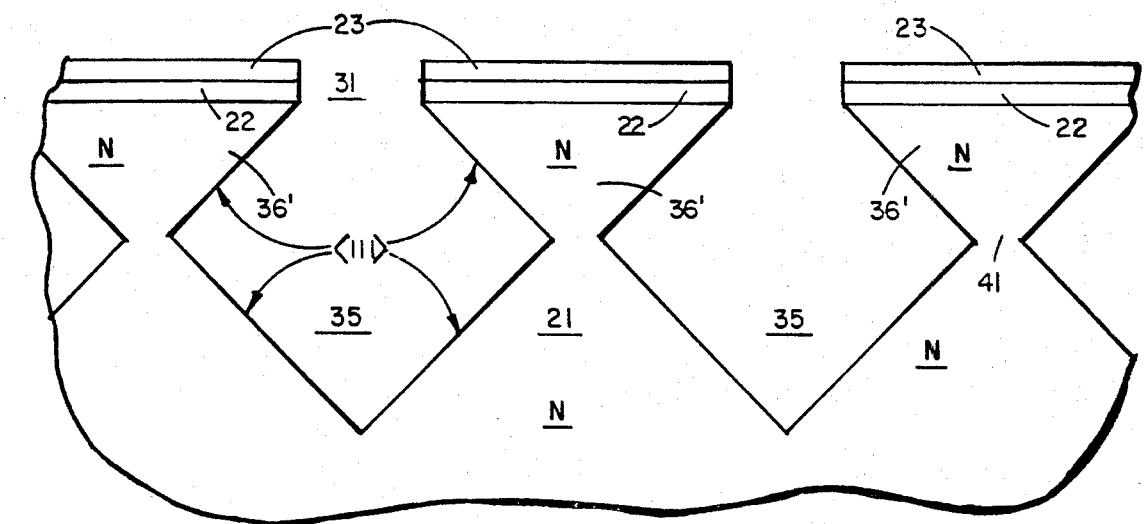
FIG. 4 shows an alternative step to FIG. 3 wherein the etching step is terminated prior to separating the transistor active regions from the substrate.

FIG. 4 shows an alternative step to that described in FIG. 3 wherein the etching is stopped earlier so that the arrays 36' are still supported from the silicon substrate by narrow connections or webs 41.

Following the etching steps of FIGS. 3 or 4, the resist 23 is removed in conventional fashion.

Figure 5:
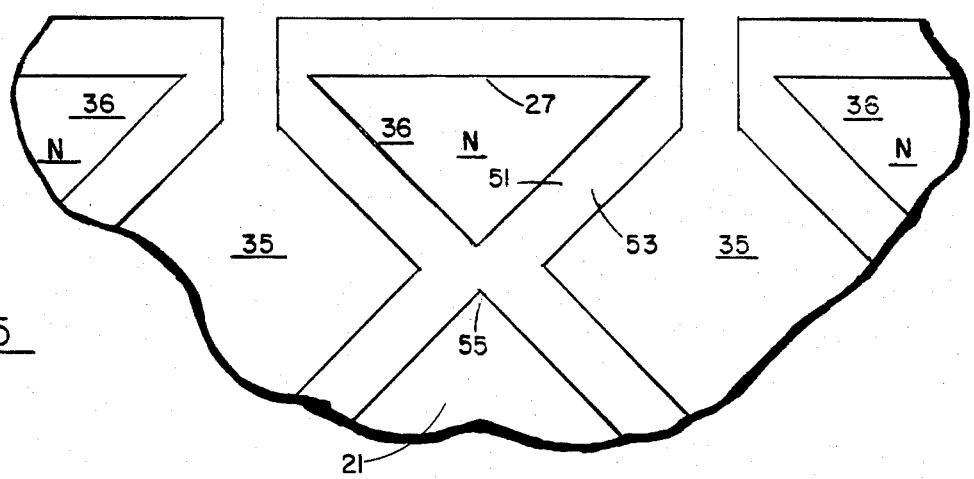
FIG. 5 is a view of the structure of FIG. 3 following oxidation of the substrate.

In FIG. 5, the structure of FIG. 3 is shown following oxidation of the substrate 21. The thermal oxide layer that results is shown as 51. At 55 there is a solid oxide support for the region 36 which will enable subsequent steps to be performed.

Figure 6:
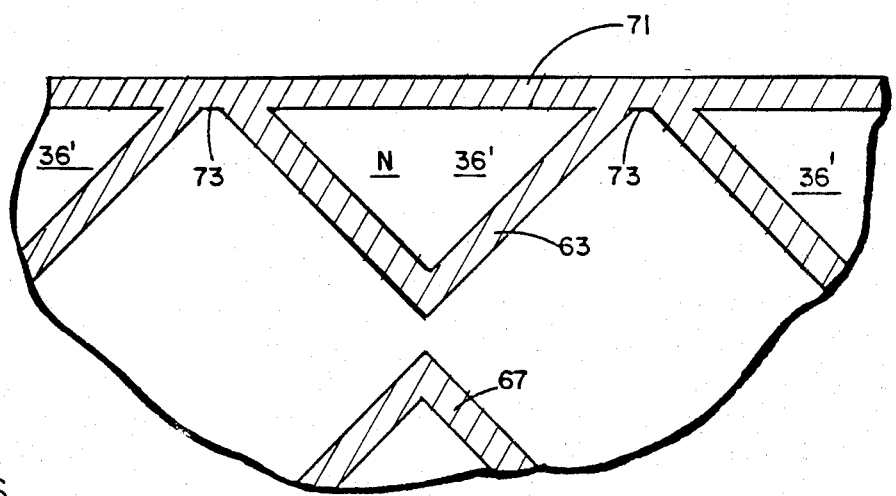
FIG. 6 is s view of the structure of FIG. 3 but without supporting webs or necks between 31 and 21.

However, this oxide is not necessary in view of the FIG. 6 arrangement wherein the oxide coating 63 and 67 do not come together to support region 36', but the upper oxide 71 extends webs 73 between the regions 36' to maintain a top support for all semi-array regions 36'.

Figure 7:
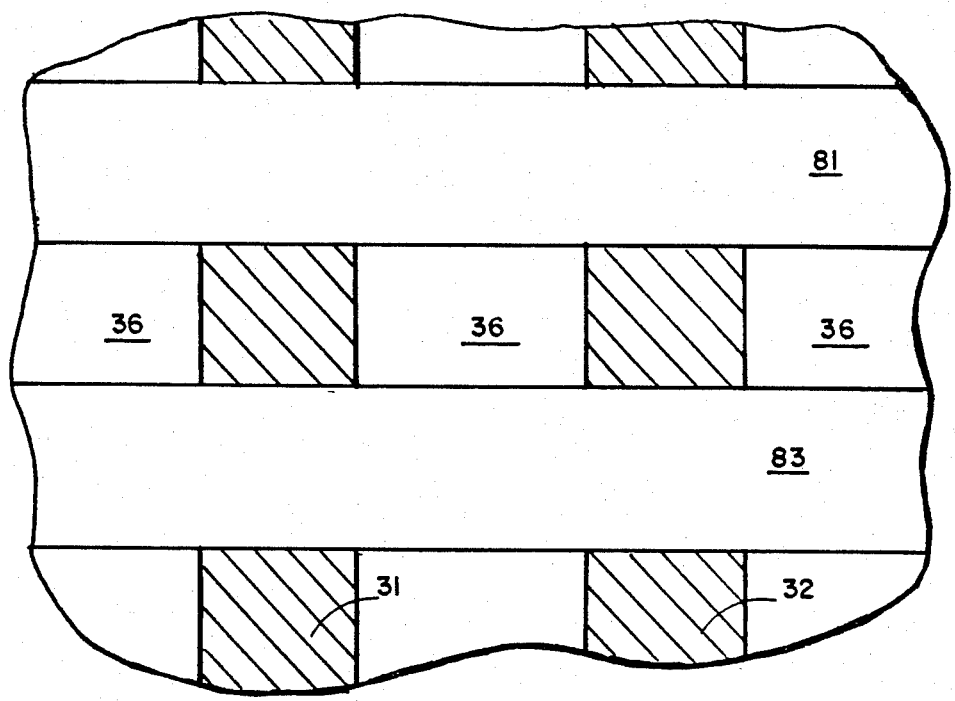
FIG. 7 shows the addition of orthogonally related slots relative to the first slots.

The succeeding step wherein support is required is shown in FIG. 7. Orthogonal slots 81 and 83 together with slots 31 and 32 form a moat around each active region 36. Also, from FIG. 7 it may be seen that slots 45 and 47 were filled with oxide except where slots 81 and 83 cut through the oxide. Obviously, slots 81 and 83 are not filled with oxide and they are nect used for the doping step to follow.

Figure 8:
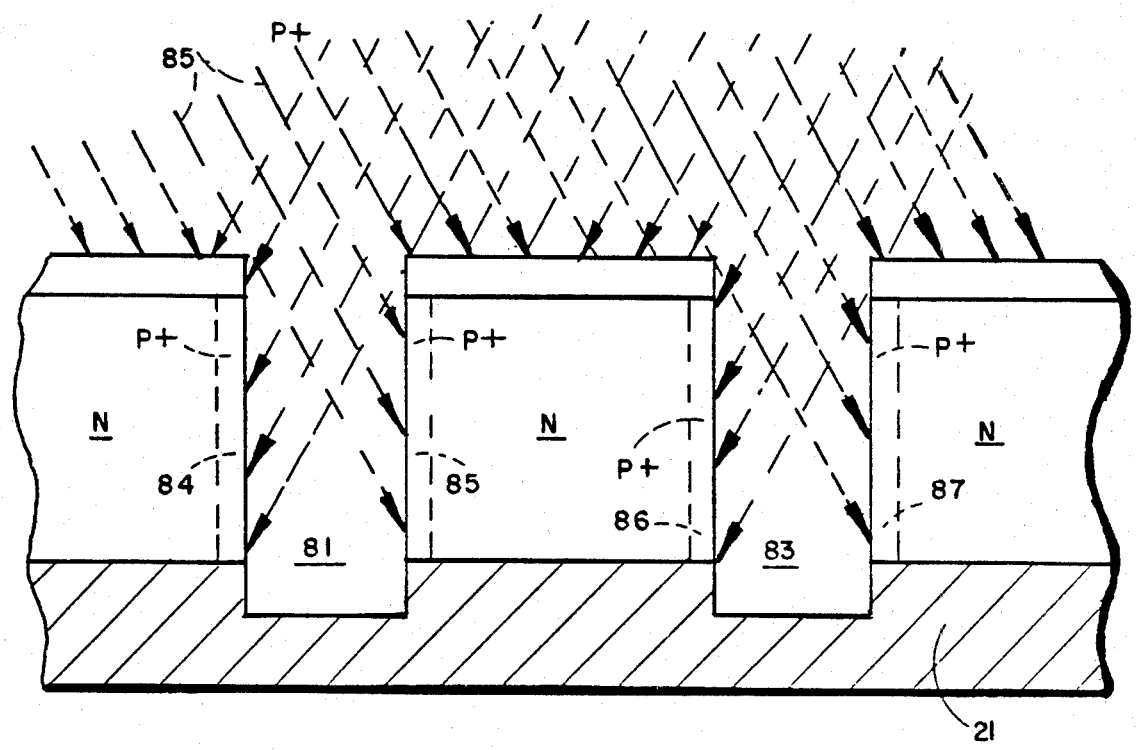
FIG. 8 illustrates the doping of the separated active transistor regions.

In FIG. 8 it may be seen that P+ ions (boron) are implanted into the edges of slots 81 and 83 as indicated by the lines 85. This ion implant forms the P+ doping.

Figure 9:
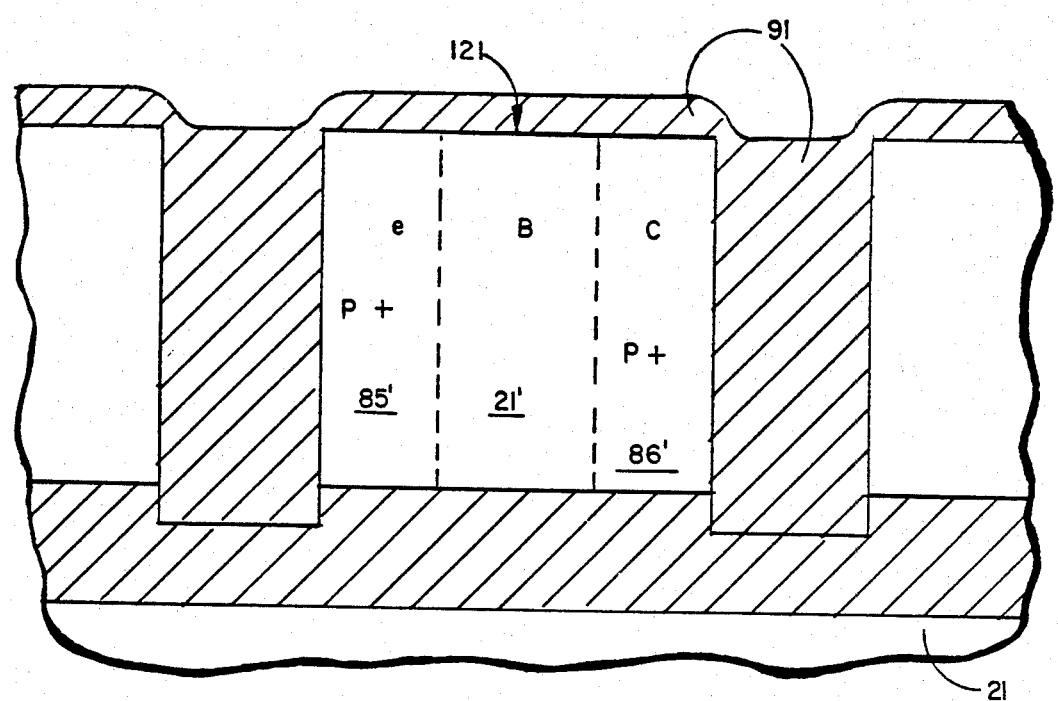
FIG. 9 is a sectional view through an active region so formed.

The next step is to drive in the P+ doping, as by heat, to form the expanded P+ regions shown in FIG. 9 at 85' and 86'.

The region 85' serves as the emitter, the region 21' (original substrate 21) serves as the base and the region 86' is the collector. The next step is to oxidize the entire structure such that the periphery of the active region 121 is entirely oxidized by the silicon oxide 91. This is what separates the active region 121 from the original substrate 21 for complete electrical isolation.

Figure 10:
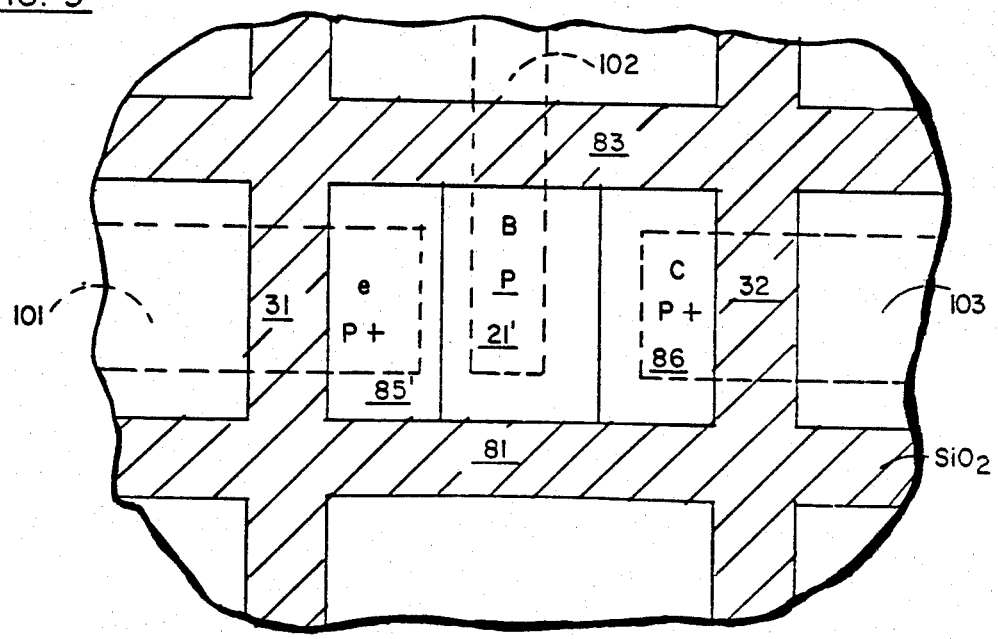
FIG. 10 is a view in plan showing the active region isolated and the electrical connections established to each electrode.

Electrical connections are made to the emitter, base and collector regions 85', 21', 86' by conventional means of metallization which overlays the metal connection 101 t- the emitter 85', 102 to the base 21' and 103 to the collector 86', as best seen in FIG. 10.

Figure 11:
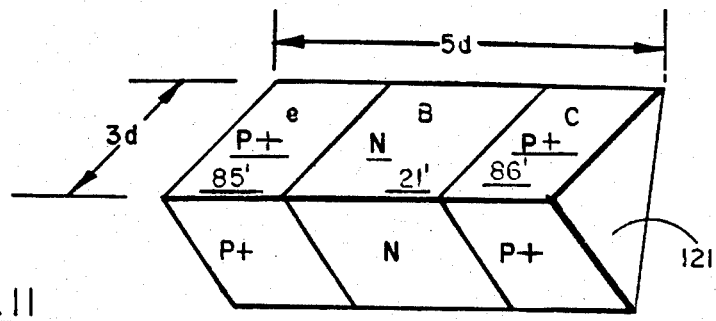
FIG. 11 is a view in perspective of the active region, per se, showing the P+NP+ fully isolated transistor region.

In FIG. 11 the active region is seen, per se, with a width dimension of 3d and a length dimension of 5d, wherein d is of the order of magnitude of 0.3 to 1 micrometer.

While modifications of the invention will occur to those skilled in the art, it is intended that the scope of the invention be defined in the appended claims wherein:

What is claimed is:

1. A method for forming an array of sub-micron dimensioned PNP-type lateral transistors on a substrate doped N-type, wherein each transistor is formed comprising the following steps:

masking the substrate to outline a pair of boundary regions for each semi-array of active regions to become transistors;

slotting the substrate in said boundary regions to a given depth;

etching away the substrate via said slots sufficiently to separate the semi-arrays of active regions from the substrate except at spaced apart supporting locations therealong;

oxidizing the substrate and semi-arrays to at least substantially completely oxidize the peripheries of the semi-arrays;

slotting the substrate orthogonally to the first mentioned slots to provide second slots with orthogonal pairs of slots defining individual transistor active regions for the respective transistors;

doping the regions defined by orthogonal pairs of slots P+ via corresponding edges of the second slots and driving in the P+ doping; and, establishing electrical connections to the outer P+ regions, and inner N region of the original substrate.

2. The method of 1 wherein:
said etching is accomplished by orientation dependent etching fluid.

3. The method claims 1 or 2 wherein:
each active region is supported from the substrate by substrate oxide.

4. The method claims 1 or 2 wherein:
the active regions are supported from the substrate by webs of oxide along the top thereof.

* * * * *